United States Patent
Ngo et al.

(10) Patent No.: US 10,290,587 B2
(45) Date of Patent: May 14, 2019

(54) COOLER WITH EMI-LIMITING INDUCTOR

(71) Applicants: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

(72) Inventors: Khai Ngo, Blacksburg, VA (US); Chi-Ming Wang, Ann Arbor, MI (US); Han Cui, Blacksburg, VA (US)

(73) Assignees: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 0 days.

(21) Appl. No.: 15/622,802

(22) Filed: Jun. 14, 2017

(65) Prior Publication Data

US 2018/0122746 A1   May 3, 2018

Related U.S. Application Data

(60) Provisional application No. 62/417,166, filed on Nov. 3, 2016.

(51) Int. Cl.
*H01L 23/552* (2006.01)
*H01L 23/367* (2006.01)
(Continued)

(52) U.S. Cl.
CPC .......... *H01L 23/552* (2013.01); *H01L 23/367* (2013.01); *H01L 23/642* (2013.01);
(Continued)

(58) Field of Classification Search
CPC ... H01L 23/552; H01L 23/367; H01L 23/642; H01L 23/645; H01L 25/0655;
(Continued)

(56) References Cited

U.S. PATENT DOCUMENTS 6,044,899 A   4/2000 Langley et al.
7,050,304 B2  5/2006 Hsu et al.
(Continued)

OTHER PUBLICATIONS

Yu Zhenyang, et al., The reviews of integrated EMI filters applied in power electronic system, 2015 Asia-Pacific Symposium on Electromagnetic Compatibility (APEMC 2015) (pp. 227-230).
(Continued)

*Primary Examiner* — Thomas Skibinski
(74) *Attorney, Agent, or Firm* — Oblon, McClelland, Maier & Neustadt, L.L.P.

(57) ABSTRACT

A power device package includes a dielectric substrate having an upper conductor layer and a lower conductor layer, a semiconductor die coupled to the upper conductor layer of the dielectric substrate via conductive adhesive, a cooler including a protruding hillock having a top surface and outer sides, the lower conductor layer of the dielectric substrate being coupled to the surface of the protruding hillock via an adhesive, and a magnetic material attached mateably around the protruding hillock. The magnetic material includes inner sides abutting the outer sides of the protruding hillock.

20 Claims, 5 Drawing Sheets

(51) Int. Cl.
*H01L 23/64* (2006.01)
*H01L 25/065* (2006.01)
*H01L 25/07* (2006.01)
*H01L 25/18* (2006.01)
*H03K 5/08* (2006.01)
*H01L 29/16* (2006.01)

(52) U.S. Cl.
CPC ........ *H01L 23/645* (2013.01); *H01L 25/0655* (2013.01); *H01L 25/072* (2013.01); *H01L 25/18* (2013.01); *H03K 5/08* (2013.01); *H01L 29/1608* (2013.01)

(58) Field of Classification Search
CPC ... H01L 25/072; H01L 25/18; H01L 29/1608; H03K 5/08
USPC ....... 327/108–112, 427, 434, 437, 512, 513; 326/82, 83, 87; 257/700, E23.079, 707, 257/691, E25.026, 715; 361/719, 720; 165/104.33, 185, 80.2, 80.3, 104.23
See application file for complete search history.

(56) References Cited

U.S. PATENT DOCUMENTS

| | | | |
|---|---|---|---|
| 7,154,174 B2* | 12/2006 | Maxwell | H01L 23/5385 257/707 |
| 7,889,503 B2 | 2/2011 | Nagareda et al. | |
| 8,213,180 B2 | 7/2012 | Zhao et al. | |
| 9,083,332 B2* | 7/2015 | Ikriannikov | H02M 3/1582 |
| 9,164,679 B2 | 10/2015 | Smith | |
| 2007/0111380 A1 | 5/2007 | Cho et al. | |
| 2008/0023821 A1 | 1/2008 | Hsu | |
| 2015/0303881 A1 | 10/2015 | Blednov et al. | |
| 2017/0345756 A1* | 11/2017 | Yin | H01L 23/5227 |

OTHER PUBLICATIONS

Fang Luo, et at, Design of a Hybrid Busbar Filter Combining a Transmission-Line Busbar Filter and a One-Turn Inductor for DC-Fed Three-Phase Motor Drive Systems; IEEE Transactions on Power Electronics, Vol. 28, No. 12, Dec. 2013 (pp. 5588-5602).

Mohammad Rouhollah Yazdani, et al., Conducted EMI reduction of a soft-single-switched boost converter using heat-sink capacitance cancellation, The 6$^{th}$ International Power Electronics, Drives Systems & Technologies Conference (PEDSTC2015), Feb. 3-4 2015 (pp. 645-649).

K.Seshu Babu , et al., Analysis and Experimentation with Passive Cancellation of Common-Mode noise in Buck Converter; ElectroMagnetic Interference and Compatibility (INCEMIC), 2006 Proceedings of the 9th International Conference (9 pages).

Mathias Blank, et al., Digital Slew Rate and S-Shape Control for Smart Power Switches to Reduce EMI Generation; IEEE Transactions on Power Electronics, Vol. 30, No. 9, Sep. 2015 (pp. 5170-5180).

* cited by examiner

| | I1 | I2 | I3 | I4 | I5 | I6 |
|---|---|---|---|---|---|---|
| I1 | 11.327 | 0.0126 | 0.0095 | 0.011 | 0.0023 | 0.0021 |
| I2 | 0.0126 | 11.387 | 0.0214 | 0.0095 | 0.0132 | 0.0098 |
| I3 | 0.0095 | 0.0214 | 11.417 | 0.0133 | 0.0099 | 0.0135 |
| I4 | 0.011 | 0.0095 | 0.0133 | 11.407 | 0.0022 | 0.0024 |
| I5 | 0.0023 | 0.0132 | 0.0099 | 0.0022 | 11.45 | 0.0012 |
| I6 | 0.0022 | 0.0098 | 0.013 | 0.0024 | 0.012 | 11.43 |

COOLER WITH EMI-LIMITING INDUCTOR

BACKGROUND

Solid state power electronics have numerous industry applications such as automotive, illumination, electricity generation, and heavy machinery. These applications may expose the driving solid state power electronics to thousands of amperes of current and/or thousands of volts of voltage. Due to the large amount of driving current/voltage, the materials and designs of power electronics may differ drastically from conventional semiconductor devices. Common device structures include diode, metal-oxide-semiconductor field-effect transistor (MOSFET), bipolar junction transistor (BJT), thyristor, triac, and insulated-gate bipolar transistor (IGBT). Solid state power electronics may be built from semiconductor materials such as silicon, silicon carbide, gallium nitride, or other elemental or compound semiconductor materials.

SUMMARY

Aspects of the disclosure provide a power device package including a dielectric substrate having an upper conductor layer and a lower conductor layer; a semiconductor die coupled to the upper conductor layer of the dielectric substrate via conductive adhesive; a cooler including a protruding hillock having a top surface and outer sides, the lower conductor layer of the dielectric substrate being coupled to the surface of the protruding hillock via an adhesive; and a magnetic material attached mateably around the protruding hillock, the magnetic material includes inner sides abutting the outer sides of the protruding hillock.

Aspects of the disclosure provide a power device assembly having a chassis, a first and a second power device package, wherein the first and second power device package each includes: a plurality of semiconductor dies, wherein each die of the plurality of semiconductor dies includes at least one transistor, a dielectric substrate that provides electrical connections to the plurality of semiconductor dies via a patterned conductor layer, the dielectric substrate includes a lower conductor layer insulated from the patterned conductor layer, a cooler that includes a plurality of hillocks each having a top surface and perimeter surfaces, at least a portion of the top surfaces of the plurality of hillocks being coupled to the lower conductor layer via adhesive, and damping means for reducing electromagnetic interference current including a magnetic frame that couples mateably around the plurality of hillocks, wherein inner surfaces of the magnetic frame abut the perimeter surfaces of the plurality of hillocks; and interconnect wires that provides electrical connections between the first and second power device package.

Aspects of the disclosure provide a method of operating a power device including the steps of activating a DC voltage supply; providing a current to a plurality of semiconductor dies; and damping an electromagnetic interference current by: providing a magnetic material abutting hillocks of a cooler, the magnetic material amplifies inductance values of the hillocks of the cooler, grounding the cooler by connecting the cooler to a ground terminal, and providing a conduction path for the electromagnetic interference current through the cooler; wherein the damping of the electromagnetic interference current reduces an amount of electrical charge flowing into the ground terminal during the activation of the DC voltage supply.

DETAILED DESCRIPTION OF EMBODIMENTS

Figure 1:
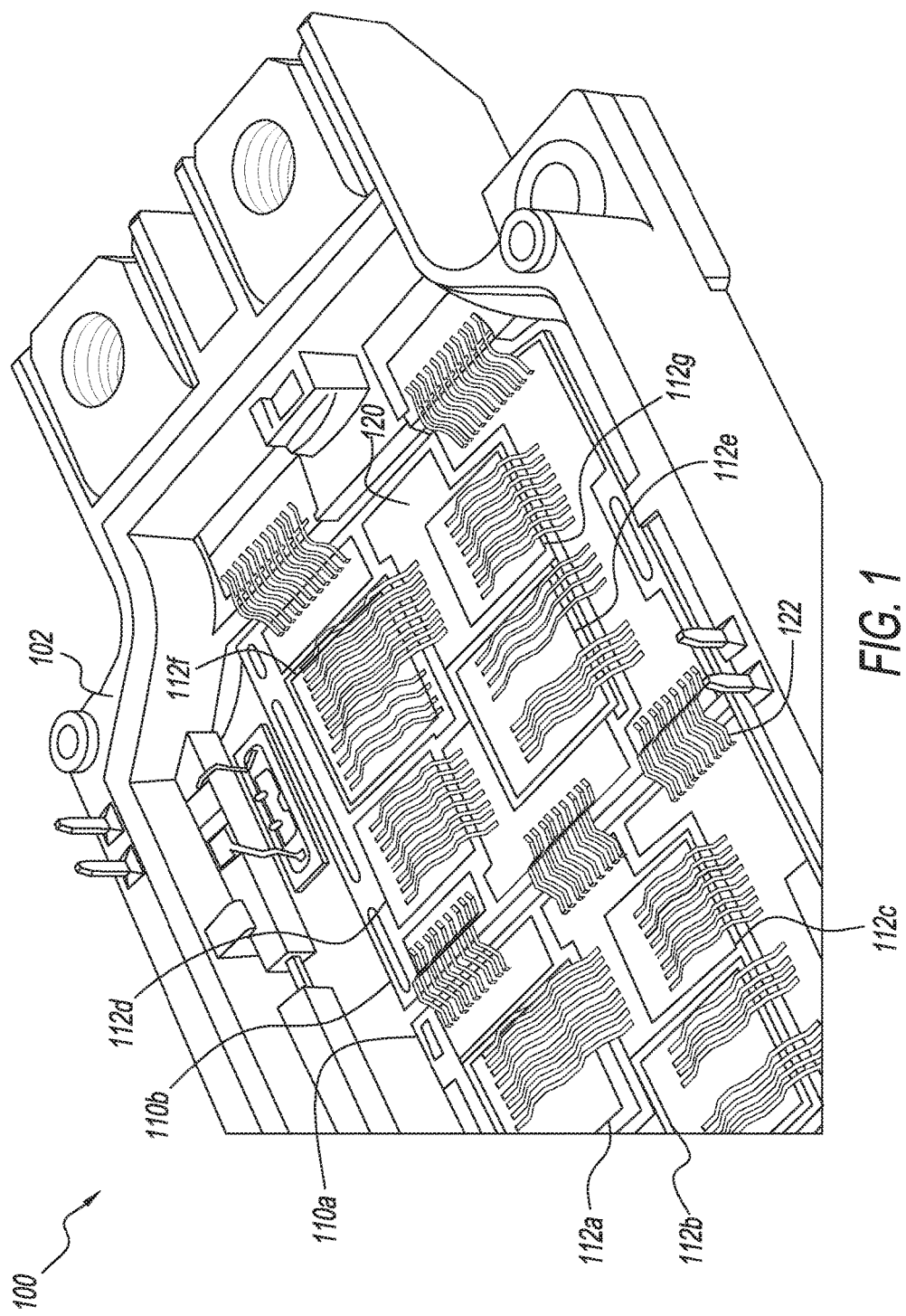
FIG. 1 illustrates an exemplary power device assembly.

FIG. 1 shows an exemplary power device assembly 100 including a chassis 102, power device packages 110a-b, a top conductive layer 120, and interconnect wires 122. In some embodiments, each of the power device packages 110a-b includes one or more dies 112a-g for switching operations. The top conductive layer 120 provides electrical connections among the dies 112a-g. The top conductive layer 120 may include copper, copper alloy, aluminum, aluminum alloy. Other metals, elements, compounds, and alloys may be used. The interconnect wires 122 provide electrical connections between the power device packages 110a-b.

Figure 2A:
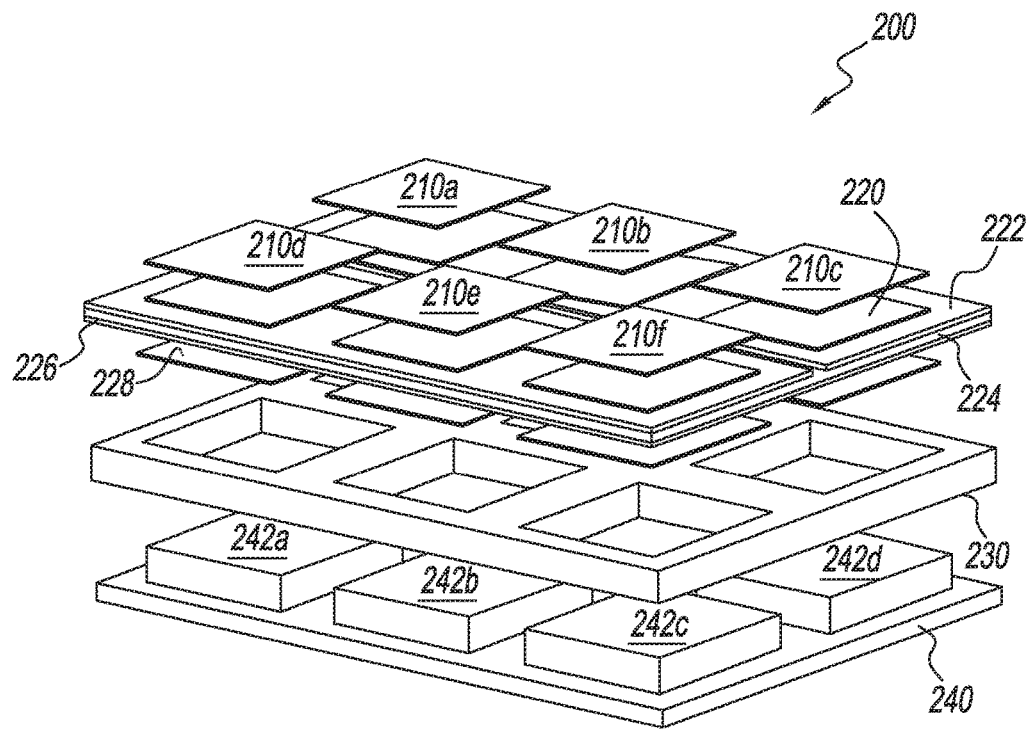
FIG. 2A illustrates a perspective diagram of an exemplary power device package.

FIG. 2A shows a perspective diagram of an exemplary power device package 200. The power device package 200 includes dies 210a-f, a top conductive adhesive 220, a top conductor layer 222, a dielectric substrate 224, a bottom conductor layer 226, a bottom adhesive 228, a magnetic material 230, and a cooler 240.

In some embodiments, the dies 210a-f may be silicon carbide dies having one or more transistors, such as metal-oxide-semiconductor field-effect transistors (MOSFETs), bipolar junction transistor (BJT), thyristor, triac, high-electron-mobility transistor, junction field effect transistor, metal-semiconductor field effect transistor, and insulated-gate bipolar transistor (IGBT). Alternatively, the dies 210a-f may be built from semiconductor materials such as silicon, germanium, gallium nitride, or other elemental or compound semiconductor materials. The one or more transistors on the dies 210a-f may be configured to conduct 10 A, 20 A, 50 A, 100 A, or 200 A of drain/emitter current and remain operational under a gate-to-source/base-to-collector voltage of 5 V, 10 V, 20 V, 30 V, 40 V, or 50 V. The one or more transistors on the dies 210a-f may be configured to remain operational under a drain-to-source/emitter-to-collector voltage of 100 V, 200 V, 500 V, 1000 V, 1200 V, 1500 V, or 2000 V. Other current and voltage limits are possible.

In certain implementations, the top conductive adhesive 220 bonds the die 210 210c to the top conductor layer 222. The top conductive adhesive 220 may include tin-based solders such as Au/Sn solder with 80% gold and 20% tin composition by mass. Other ratios are possible. In alternative embodiments, the top conductive adhesive 220 may include tin-silver-copper, gold-germanium, and indium.

During the bonding process, the top conductive adhesive may be selectively deposited onto the top conductive layer 222.

In exemplary embodiments, the top conductive layer 222 includes plated copper having a predetermined pattern. The predetermined pattern may be formed during the plating of the copper, or etched after the plating. The top conductive layer 222 may form electrically conductive channels between the dies 210a-f. A thickness of the top conductive layer 222 may be 10 µm. Alternatively, the top conductive layer 222 may be 5 µm, 8 µm, 10 µm, 12 µm, or 15 µm. Other thicknesses are possible. The top conductive layer 222 may alternatively include copper alloy, aluminum, aluminum alloy. Other metals, elements, compounds, and alloys may be used.

In some embodiments, the dielectric substrate 224 is an insulating substrate that provides structural support to the dies 210a-f and the top conductor layer 222. The dielectric substrate 224 may include alumina, aluminum nitride, or any other insulating material. A thickness of the dielectric substrate 224 may range from 0.5 millimeter (mm) to 2 mm. For example, the dielectric substrate 224 may be 0.5 mm, 0.75 mm, 1 mm, 1.25 mm, 1.5 mm, 1.75 mm, or 2 mm. Other thicknesses are possible.

In some implementations, the bottom conductive layer 226 may be deposited on an opposite side, with respect to the dielectric substrate, of the top conductor layer 222. The bottom conductive layer 226 may include the same or different material as the top conductive layer 222. The bottom conductive layer 226 may have the same thickness and pattern as the top conductive layer 222 to reduce warping of the dielectric substrate 224. Alternatively, the bottom conductive layer 226 may have different thicknesses and/or pattern.

In certain embodiments, the bottom adhesive 228 bonds the dielectric substrate 224 to the cooler 240. The bottom adhesive 228 may include the same material as the top conductive adhesive 220. Alternatively, the bottom adhesive 228 may be a non-conductive adhesive.

In exemplary implementations, the power device package 200 includes damping means for reducing a noise current generated during a switching process. The damping means include the magnetic material 230, which may be mated with the cooler 240. Specifically, the magnetic material 230 includes holes that mateably couple with hillocks 242a-d of the cooler 240. The mating of the magnetic material 230 and the cooler 240 may form inductors within the cooler 240. The inductance values of the inductors may depend on the ferromagnetic properties and the dimensions of the magnetic material 230. Exemplary magnetic materials include compounds such as soft magnetic composite, ferrite, powder core including Iron Oxide, Zinc, Manganese, and Nickel. Other magnetic materials may also be used to alter the inductance values of the inductors within the cooler 240. The magnetic material 230 may be assembled around the hillocks 242a-d of the cooler 240 using multiple ferromagnetic materials.

In certain embodiments, the cooler 240 may be a heat sink, a heat spreader, or a base plate having fluid channels. The cooler 240 may assist with heat dissipation of the dielectric substrate 224 and the dies 210a-f.

Figure 2B:
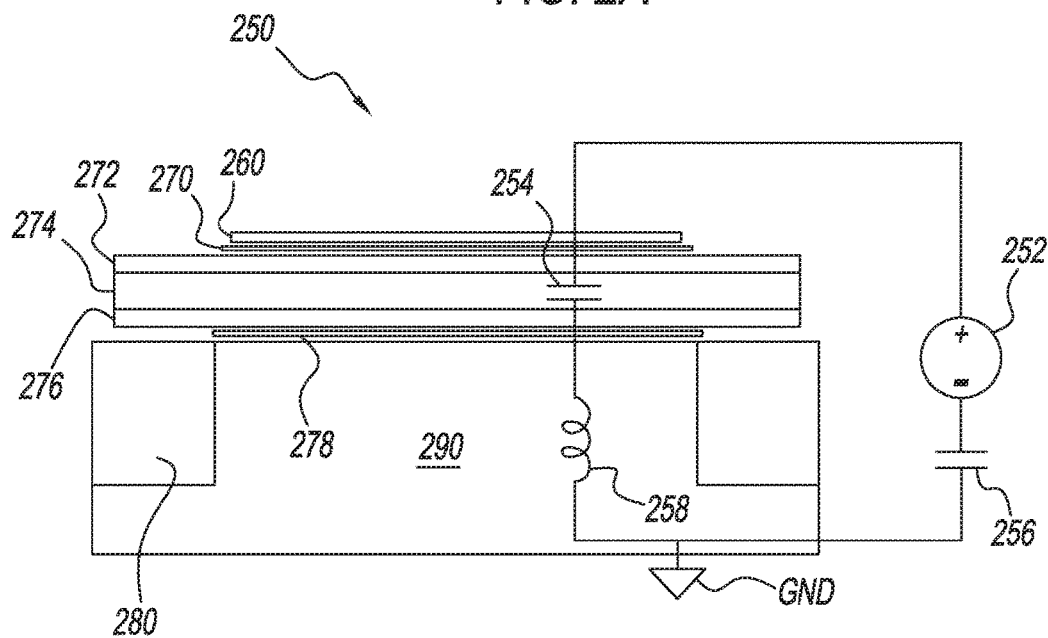
FIG. 2B illustrates a schematic cross-sectional view of an exemplary power device package with an overlaying noise circuit diagram.

FIG. 2B shows a schematic cross-sectional view of an exemplary power device package 250 with an overlaying noise circuit diagram. The noise circuit diagram includes DC voltage source 252, a parasitic capacitor 254, a shunt capacitor 256, and a cooler inductor 258. The power device package 250 includes a die 260, a top conductive adhesive 270, a top conductor layer 272, a dielectric substrate 274, a bottom conductor layer 276, a bottom adhesive layer 278, a magnetic material 280, and a cooler 290.

During normal operation, the DC voltage source 252 may be switched on and off. The switching of the DC voltage source 252 causes a rapid change (increase or decrease) in the noise voltage appeared across power device package, which generates a noise current ($I_{EMI}$) in the noise circuit loop. The magnitude of the noise current is proportional to the capacitance of the parasitic capacitor 254 and the rate of change of the switching. For example, as the DC voltage source 252 switches from off to on, a surge of $I_{EMI}$ travels through the parasitic capacitor 254, and subsequently, the cooler inductor 258, which is formed from the mating of the magnetic material 280 and the cooler 290. As the noise current flows through the cooler 290 into the ground, it passes through the cooler inductor 258, which produces an induced voltage across the cooler inductor 258 to oppose the flow of $I_{EMI}$. The induced voltage across the cooler inductor 258 reduces the negative impact and magnitude of the $I_{EMI}$ flowing into a ground terminal GND.

Figure 3:
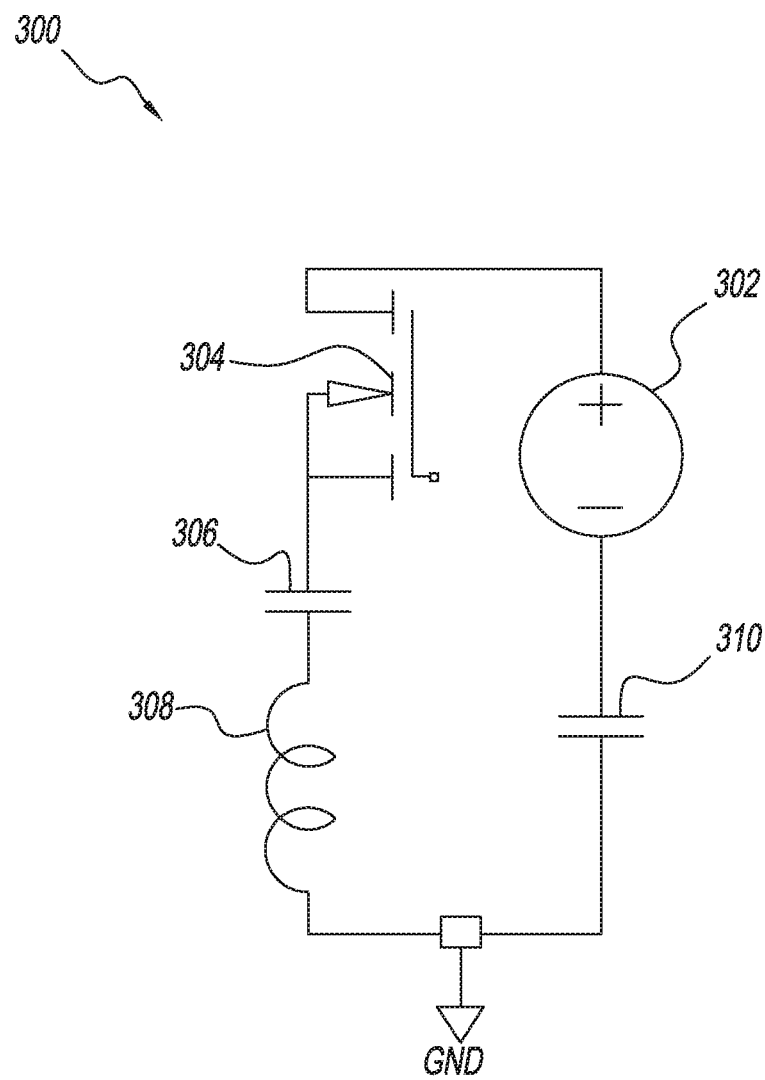
FIG. 3 illustrates another noise circuit diagram of an exemplary power device package.

FIG. 3 illustrates another noise circuit diagram 300 of an exemplary power device package. The diagram includes a DC voltage source 302, a switch 304, a parasitic capacitor 306, a cooler inductor 308, and a shunt capacitor 310. In certain implementations, the cooler inductor 308 reduces the $I_{EMI}$ flowing into a ground terminal GND. A significant $I_{EMI}$ flowing into the ground terminal GND may impact the operations of other circuits (not shown) simultaneously connected to the ground terminal GND. During normal operation, for example, the switch 304 may turn from off to on, causing a sudden increase in voltage across the parasitic capacitor 306. The sudden increase in voltage in turn leads to a surge of $I_{EMI}$ flowing from the parasitic capacitor 306 toward a direction of the ground terminal GND. In response to the $I_{EMI}$ surge, an inductor voltage appears across the cooler inductor 308 to resist the surge. The induced inductor voltage minimizes the amount of $I_{EMI}$ flowing into the ground terminal.

In other embodiments, during normal operation, the switch 304 may turn from on to off, causing a sudden decrease in voltage across the parasitic capacitor 306. The sudden decrease in voltage in turn leads to a surge of $I_{EMI}$ flowing from the parasitic capacitor 306 away from the ground terminal GND. In response to the $I_{EMI}$ surge, an inductor voltage appears across the cooler inductor 308 to resist the surge. The induced inductor voltage minimizes the amount of $I_{EMI}$ flowing out of the ground terminal.

Figure 4:
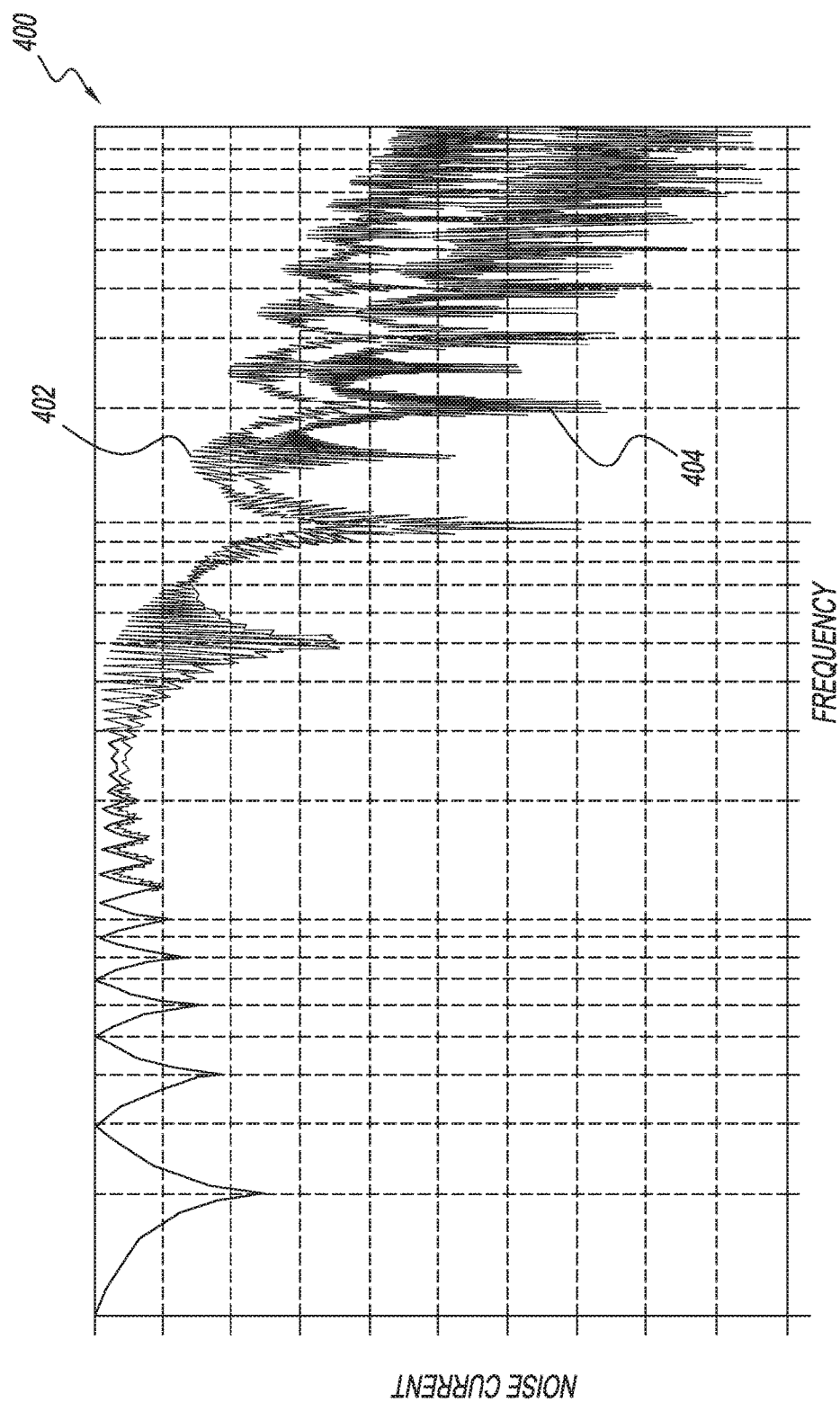
FIG. 4 illustrates a common mode electromagnetic interference spectrum of the exemplary power device package shown in FIG. 2A and a conventional power device package.

Turning now to FIG. 4, which shows a common mode electromagnetic interference (EMI) spectrum of the exemplary power device package shown in FIG. 2A and a conventional power device package. A curve 402 shows the spectral response of a conventional power device package without the cooler inductor. A curve 404 shows the spectral response of the exemplary power device package shown in FIG. 2A.

Figures 5A, 5B:
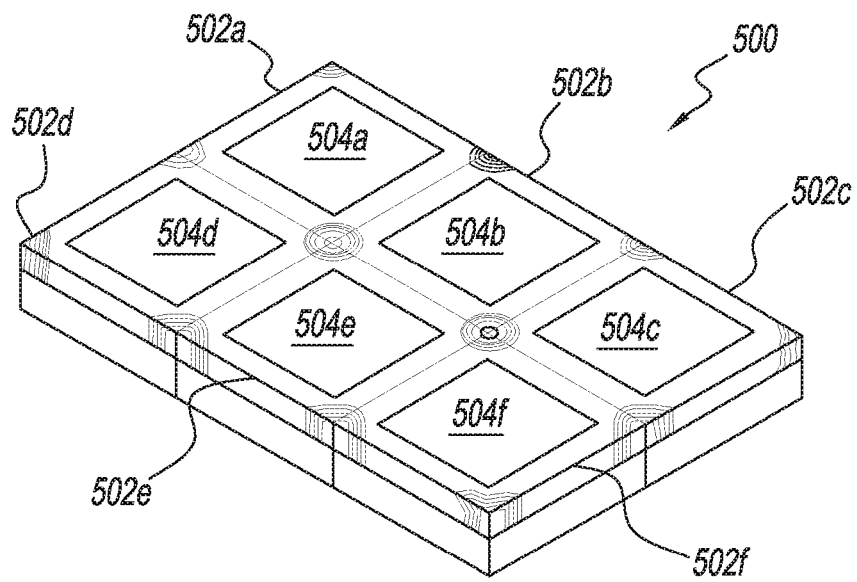
FIGS. 5A and 5B illustrate an exemplary simulation cooler of an exemplary power device package and a table of simulated inductance values.

FIGS. 5A and 5B show an exemplary simulation cooler 500 having magnetic frames 502a-f and hillocks 504a-f, and a table showing the values of simulated inductance of the hillocks 504a-f. In some embodiments, each one of the magnetic frames 502a-f may be 2 mm thick, with a frame width of 2 mm. The simulated cooler 500 may be 42 mm long, 28 mm wide, and 5 mm high. The hillocks 504a-f may be 10 mm long, 10 mm wide, and 2 mm high. Other dimensions are possible. Exemplary parameters for the simulation include a saturation induction of 1.56 Tesla, an annealed DC permeability of 600,000 microHenry, an electrical resistivity of 130 microOhm-centimeter, and a Curie temperature of 395 degrees Celsius. Other parameters may also be used.

Referring now to FIG. 5B, the table shows the mutual inductance values of the hillocks 504a-f. Each one of the 5 hillocks 504a-f in the simulated cooler 500 has a mutual inductance value greater than 11 microHenry.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, some implementations may be performed on modules or hardware not identical to those described. Accordingly, other implementations are within the scope that may be claimed.

The invention claimed is:

1. A power device package, comprising:
a dielectric substrate including an upper conductor layer and a lower conductor layer;
a semiconductor die coupled to the upper conductor layer of the dielectric substrate via conductive adhesive;
a cooler including a protruding hillock having a top surface and outer sides, the lower conductor layer of the dielectric substrate attached to the top surface of the protruding hillock via an adhesive; and
magnetic material coupled to the protruding hillock, the magnetic material includes inner sides abutting the outer sides of the protruding hillock.

2. The power device package of claim 1, wherein the magnetic material includes a hole adapted to mate with the protruding hillock.

3. The power device package of claim 1, further comprising a second protruding hillock coupled to the magnetic material.

4. The power device package of claim 1, wherein the cooler is a heat sink.

5. The power device package of claim 1, wherein the semiconductor die is a silicon carbide die.

6. The power device package of claim 1, wherein the magnetic material and the protruding hillock form an inductor with inductance exceeding 11 microHenry.

7. A power device assembly, comprising:
a chassis,
a first and a second power device package, wherein the first and second power device package each include:
a plurality of semiconductor dies, wherein each die of the plurality of semiconductor dies includes at least one transistor,
a dielectric substrate that provides electrical connections to the plurality of semiconductor dies via a patterned conductor layer, the dielectric substrate includes a lower conductor layer insulated from the patterned conductor layer,
a cooler that includes a plurality of hillocks each including a top surface and perimeter surfaces, at least a portion of the top surfaces of the plurality of hillocks being attached to the lower conductor layer via adhesive, and
damping means for reducing electromagnetic interference current, wherein the damping means abut the perimeter surfaces of the plurality of hillocks; and
interconnect wires that provide electrical connections between the first and second power device package.

8. The power device assembly of claim 7, wherein the cooler is a heat spreader.

9. The power device assembly of claim 7, further comprising silicon carbide metal-oxide-semiconductor field-effect transistors on the plurality of semiconductor dies.

10. The power device assembly of claim 7, wherein the damping means includes a magnetic frame that couples mateably around the plurality of hillocks.

11. The power device assembly of claim 10, wherein the magnetic frame includes two or more sub-frames.

12. The power device assembly of claim 10, wherein the magnetic frame includes soft magnetic material selected from a group consisting of Iron Oxide, Zinc, Manganese, and Nickel.

13. The power device assembly of claim 10, wherein the magnetic frame includes magnetic material that increases a cooler inductance of the cooler.

14. The power circuit of claim 7, wherein first and second driving transistors are disposed on at least two semiconductor substrates.

15. A method of operating a power device, comprising:
activating a DC voltage supply;
providing a current to a plurality of semiconductor dies; and
damping an electromagnetic interference current by:
providing a magnetic material abutting hillocks of a cooler, the magnetic material amplifying inductance values of the hillocks of the cooler,
grounding the cooler by connecting the cooler to a ground terminal, and
providing a conduction path for the electromagnetic interference current through the cooler;
wherein the damping of the electromagnetic interference current reduces an amount of electrical charge flowing into the ground terminal during the activation of the DC voltage supply.

16. The method of claim 15, further comprising the steps of:
deactivating the DC voltage supply; and
damping a second electromagnetic interference current, wherein the damping of the second electromagnetic interference current reduces a second amount of electrical charge flowing out of the ground terminal during the deactivation of the DC voltage supply.

17. The method of claim 15, further comprising the step of dissipating heat generated by the plurality of semiconductor dies via the cooler.

18. The method of claim 15, further comprising the step of switching one or more silicon carbide transistors on the plurality of semiconductor dies.

19. The method of claim 18, further comprising the step of driving a drain current greater than 100 A through the one or more silicon carbide transistors.

20. The circuit of claim 18, further comprising the step of applying a drain-to-source voltage greater than 1000 V to the one or more silicon carbide transistors.

* * * * *